(12) United States Patent
Meunier-Beillard et al.

(10) Patent No.: US 7,923,339 B2
(45) Date of Patent: Apr. 12, 2011

(54) METHOD OF PRODUCING AN EPITAXIAL LAYER ON SEMICONDUCTOR SUBSTRATE AND DEVICE PRODUCED WITH SUCH A METHOD

(75) Inventors: Philippe Meunier-Beillard, Kortenberg (BE); Hendrik G. A. Huizing, Neerkant (NL)

(73) Assignee: NXP B.V., Eindhoven (NL)

( * ) Notice: Subject to any disclaimer, the term of this patent is extended or adjusted under 35 U.S.C. 154(b) by 310 days.

(21) Appl. No.: 11/721,033

(22) PCT Filed: Nov. 29, 2005

(86) PCT No.: PCT/IB2005/053945
§ 371 (c)(1),
(2), (4) Date: Aug. 25, 2009

(87) PCT Pub. No.: WO2006/061731
PCT Pub. Date: Jun. 15, 2006

(65) Prior Publication Data
US 2009/0305488 A1   Dec. 10, 2009

(30) Foreign Application Priority Data
Dec. 6, 2004   (EP) .................................... 04106310

(51) Int. Cl.
*H01L 21/336*   (2006.01)
(52) U.S. Cl. ........... 438/308; 257/E21.09; 257/E21.283; 257/E21.334; 438/770; 438/916

(58) Field of Classification Search ............. 257/E21.09, 257/E21.283, E21.334; 438/308, 770, 916
See application file for complete search history.

(56) References Cited

U.S. PATENT DOCUMENTS

| 6,087,684 A | 7/2000 | Amamiya |
| 6,388,307 B1 | 5/2002 | Kondo et al. |
| 6,576,535 B2 | 6/2003 | Drobny et al. |
| 2003/0082882 A1 | 5/2003 | Babcock et al. |

FOREIGN PATENT DOCUMENTS

| EP | 0762484 A1 | 3/1997 |
| EP | 0818829 A1 | 1/1998 |
| EP | 0889502 A2 | 1/1999 |
| JP | 05074800 A | 3/1993 |
| JP | 2000068283 A | 9/2000 |
| WO | 03015177 A1 | 2/2003 |

*Primary Examiner* — Asok K Sarkar

(57) ABSTRACT

The invention relates to the manufacture of an epitaxial layer, with the following steps: providing a semiconductor substrate; providing a Si—Ge layer on the semiconductor substrate, having a first depth; —providing the semiconductor substrate with a doped layer with an n-type dopant material and having a second depth substantially greater than said first depth; performing an oxidation step to form a silicon dioxide layer such that Ge atoms and n-type atoms are pushed into the semiconductor substrate by the silicon dioxide layer at the silicon dioxide/silicon interface, wherein the n-type atoms are pushed deeper into the semiconductor substrate than the Ge atoms, resulting in a top layer with a reduced concentration of n-type atoms; removing the silicon dioxide layer; growing an epitaxial layer of silicon on the semiconductor substrate with a reduced outdiffusion or autodoping.

10 Claims, 3 Drawing Sheets

METHOD OF PRODUCING AN EPITAXIAL LAYER ON SEMICONDUCTOR SUBSTRATE AND DEVICE PRODUCED WITH SUCH A METHOD

The invention relates to growing an epitaxial layer on a semiconductor substrate. Nowadays, many semiconductor devices are manufactured in or on an epitaxial layer which is grown on a semiconductor substrate. Growing such an epitaxial layer on a semiconductor substrate requires an epitaxial deposition of a lightly doped layer (e.g., 1E14-1E17 atoms/cm$^3$) upon a heavily doped substrate (e.g., 1E19-1E21 atoms/cm$^3$) or part of such a substrate. The substrate may be uniformly doped with a dopant or may comprise a plurality of buried layers. Such buried layers are present in predetermined locations. They may be of the same conductivity type, i.e., either p-type or n-type, all over the substrate, or alternatively buried layers of different conductivity types may be provided in different locations on the substrate. During epitaxial deposition on the substrate, dopants may unintentionally enter the growing epitaxial layer from several sources like:

outdiffusion: this relates to solid source diffusion of dopants from the heavily doped substrate into the growing epitaxial layer;

vapor phase autodoping: this relates to dopant evaporation from the heavily doped substrate into the space surrounding the substrate and re-incorporation of the same dopants into the growing epitaxial layer.

As is known to those skilled in the art, a difference is often made between vertical and lateral autodoping. Without outdiffusion and autodoping the doping concentrations would abruptly change from the highly doped substrate to the lightly doped epitaxial layer. This situation is the preferred situation from the point of view of performance of devices made in the epitaxial layer. However, this concentration change is not as abrupt as desired owing to outdiffusion and autodoping.

Many attempts have been made to prevent autodoping and/or outdiffusion. One way of preventing autodoping and/or outdiffusion is disclosed in US2003/0082882. This prior art document discloses the use of a diffusion barrier on a buried collector region in a substrate, comprising e.g. a high concentration of boron (B). The diffusion barrier comprises e.g. silicon-germanium-carbon (SiGeC). Such a diffusion barrier is known to retard the outdiffusion of B from the buried layer when the epitaxial layer grows on the substrate. Such a diffusion barrier may also be used for other p-type materials in the buried layer. However, the use of SiGeC as a diffusion barrier for n-type materials, like arsenic (As) or phosphorus (P), is not possible. This is because n-type materials like As and P diffuse easily into SiGeC.

It is an object of the present invention to provide a method of growing an epitaxial layer on a semiconductor substrate that results in less autodoping and/or outdiffusion of n-type dopants into the substrate, which substrate is already doped with dopants.

To that end, the present invention provides a method as claimed in claim 1.

Claim 2 defines an alternative to the method claimed in claim 1.

The present invention is based on the recognition that X atoms, possibly comprising Ge, within a Si—X layer on top of the substrate can be used to prevent to a considerable extent that n-type dopants escape from the doped substrate during growing of the epitaxial layer on the substrate, despite n-type atoms like As diffusing easily into a SiGe(C) layer. As will be explained in detail below, this can be done by using the X atoms prior to growing the epitaxial layer to push the n-type dopants deeper into the doped substrate such that the amount of n-type dopants in a thin top layer on the substrate surface is reduced. This effect of the atoms X pushing the n-type atoms from the surface of the substrate into the semiconductor substrate results from an oxidation action whereby a silicon dioxide (SiO$_2$) layer is formed on the substrate after said substrate has been provided with the Si—X layer and before the epitaxial layer is grown. It can be demonstrated that the dopant atoms, like As, are to a certain extent replaced by X atoms at the SiO$_2$/Si interface during this oxidation. Thus, when said SiO$_2$ is removed, a top layer results comprising a reduced amount of n-type dopants. When the epitaxial layer is subsequently grown on the substrate, fewer n-type dopants will be present in the top layer of the substrate, resulting in less autodoping and/or outdiffusion of n-type dopants.

The present invention will now be explained with reference to a few examples, which are not intended to limit the scope of the present invention, but only to illustrate the present invention.

One example of the method in accordance with the present invention will be explained with reference to FIGS. 1a-1f.

Figure 1A:
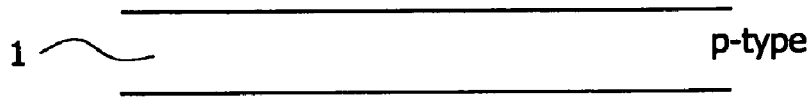
FIGS. 1a-1f show one example of growing an epitaxial layer on a silicon substrate with reduced outdiffusion and/or autodoping.

FIG. 1a shows a p-type substrate 1. The p-type substrate 1 may be part of a larger substrate entirely of the p-type. Alternatively, the p-type substrate 1 may be part of a larger substrate having various p-type portions and n-type portions. In most cases, the p-type substrate 1 will be doped to a level of typically 1E15 atoms/cm$^3$. The dopant may be, for example, boron (B), but alternatively the substrate 1 may be of an intrinsic type. As a further alternative, the substrate may be of an n-type, although this is not standard. The substrate 1 may be provided as a thin layer on another layer (not shown), for example an insulating layer or the like.

Figure 1B:
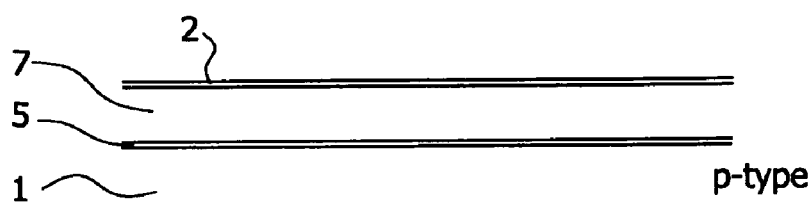

In a next action, FIG. 1b, a thin layer 5 is grown on the substrate 1. The thin layer 5 comprises Si—X, where X comprises, e.g. Ge. X may also comprise some carbon C. If Ge is used, the amount of Ge may be 10 at %. However, other amounts of Ge may be used provided that no relaxation of the strained layer occurs during subsequent processing. Typical values are in the range of 5 to 30 at %.

The layer 5 may have a thickness of 5-15 nm. However, the invention is not restricted to the layer 5 having such a thickness.

In a next action, also shown in FIG. 1b, an intrinsic layer 7 of Si is grown on the thin layer 5. The intrinsic layer 7 may have a thickness of 180 nm, however, this is only intended as an example.

If X=Ge, the layers 5 and 7 may be grown in one and the same epitaxial growing action. SiGe may be grown in such an epitaxial growing action at a temperature of 973 K (700° C.), a pressure of 532 Pa (40 torr), H$_2$=20 slm, SiH$_2$Cl$_2$=20 sccm, GeH$_4$=40 sccm. The thickness of the SiGe layer 5 will be 5 or 15 nm for a deposition time of 25 sec. or 1 min. 15 sec., respectively. The Si layer 7 is then grown in that the supply of SiH$_2$Cl$_2$ is changed to SiH$_4$ of 200 sccm during 4 min. 25 sec. under the same temperature and pressure conditions.

Next, also shown in FIG. 1b, a thin layer 2 of SiO$_2$ is formed on layer 5. This may be done, for example, in a dry oxidation action. The thickness of the SiO$_2$ layer 2 may be 20 nm. However, the SiO$_2$ layer 2 may have any other thickness, as required.

Figure 1C:
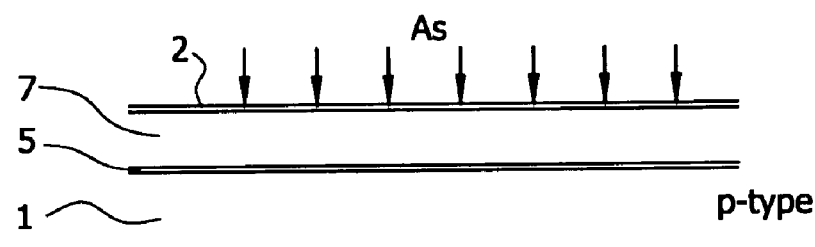

After the SiO$_2$ layer 2 has been produced, an n-type implantation action is carried out. In the example of FIG. 1c, As is used as the implanting dopant. However, P may be used instead, or any other suitable n-type dopant. The As atoms may be implanted with an energy of E=50 KeV and a dose of 1E16 at·cm$^2$. However, other figures may be used, for example, the energy may be between 10 and 150 keV and the dose may be between 1E15 and 2E16 cm$^{-2}$.

Figure 1D:
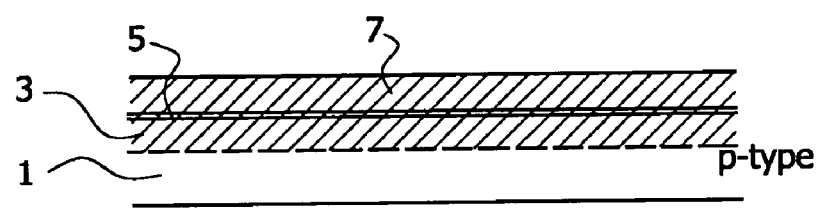

As shown in FIG. 1d, a buried layer 3 will result that extends deeper into the substrate 1 than the Si—X layer 5. Note that, as shown in FIG. 1d, the substrate 1, the Si—X layer 5, and the intrinsic layer Si layer 7 all comprise dopant atoms, for example As.

After the n-type dopant has been implanted into the substrate to form buried layer 3, the SiO$_2$ layer 2 is removed, e.g. by stripping. It is observed that there may be a preference to use SiO$_2$ as the layer 2, but that the invention is not limited to the use of SiO$_2$. Any other suitable insulating layer 2 may be used instead.

After the SiO$_2$ layer 2 has been removed, another SiO$_2$ layer (not shown) of, say, 10 nm thickness is grown, e.g. by dry oxidation. This SiO$_2$ layer functions as a capping layer for a subsequent annealing action. This annealing action may be done at a temperature of about 1373 K (about 1100° C.) during a time period of 50 minutes. Other temperatures or time periods may be used, as required.

Figure 1E:
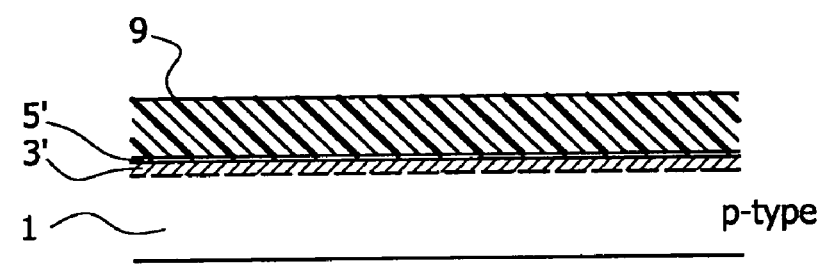

In a next action, shown in FIG. 1e, a SiO$_2$ layer 9 is grown on the substrate. This may be done by means of a wet oxidation action at about 1323 K (about 1050° C.), converting the 180 nm thick Si layer 7 into the SiO$_2$ layer 9. In this case the thickness of SiO$_2$ layer 9 may be about 250 nm. However, if required, SiO$_2$ layer 9 may have another thickness. Several effects occur during growing of the SiO$_2$ layer 9. First of all, the n-type dopants in the Si layer 4 are pushed into the substrate. At a certain moment in time, the growing SiO$_2$ reaches the Si—X layer 5. If the Si—X layer 5 comprises SiGe, the Ge atoms are pushed into the substrate 1 at the interface of SiO$_2$ and Si. However, the n-type atoms, e.g. As, are also pushed into the substrate 1 at the SiO$_2$/Si interface. Since these atoms have been moved, the SiGe layer is now referenced 5', and the buried layer is now referenced 3'. It can be shown that the Ge atoms are more difficult to push into the substrate 1 than the n-type dopant atoms such as As, with the result that the As atoms are pushed deeper into the substrate 1 than the Ge atoms. Ge takes hold of the locations where As would have liked to be too, resulting in a high Ge concentration and a reduced As concentration at the SiO$_2$/Si interface. At the same time, where the amount of Ge within SiGe layer 5 is not too large, i.e. further away from this interface, As diffuses easily into the SiGe layer. This results in the layer 5' having a top layer with a reduced concentration of the n-type dopant and an increased Ge concentration.

The next action in the method of producing an epitaxial layer on the substrate 1 is explained with reference to FIG. 1f. First of all, SiO$_2$ layer 9 is removed. This may be done, e.g. by a HF-dip in 2 vol % HF in an aqueous solution during a time period of 40 minutes, followed by a H$_2$ bake at about 1273 K (about 1000° C.) during 30 sec., H$_2$=60 slm, P=532 Pa (40 torr). Other concentrations, temperatures, and time periods may be used. Alternative methods of removing the SiO$_2$ layer 4 may be used as well. Then an epitaxial layer 6 is grown on the substrate, e.g. at a temperature of 1273 K (about 1000° C.) during a time period of 30 sec., H$_2$=60 slm, P=532 Pa (40 torr), SiH$_2$Cl$_2$=300 sccm. The epitaxial layer 6 will then have a thickness of 340 nm and is preferably intrinsic. Other thicknesses may be used. Similarly, other temperatures and time periods may be used.

Figure 2:
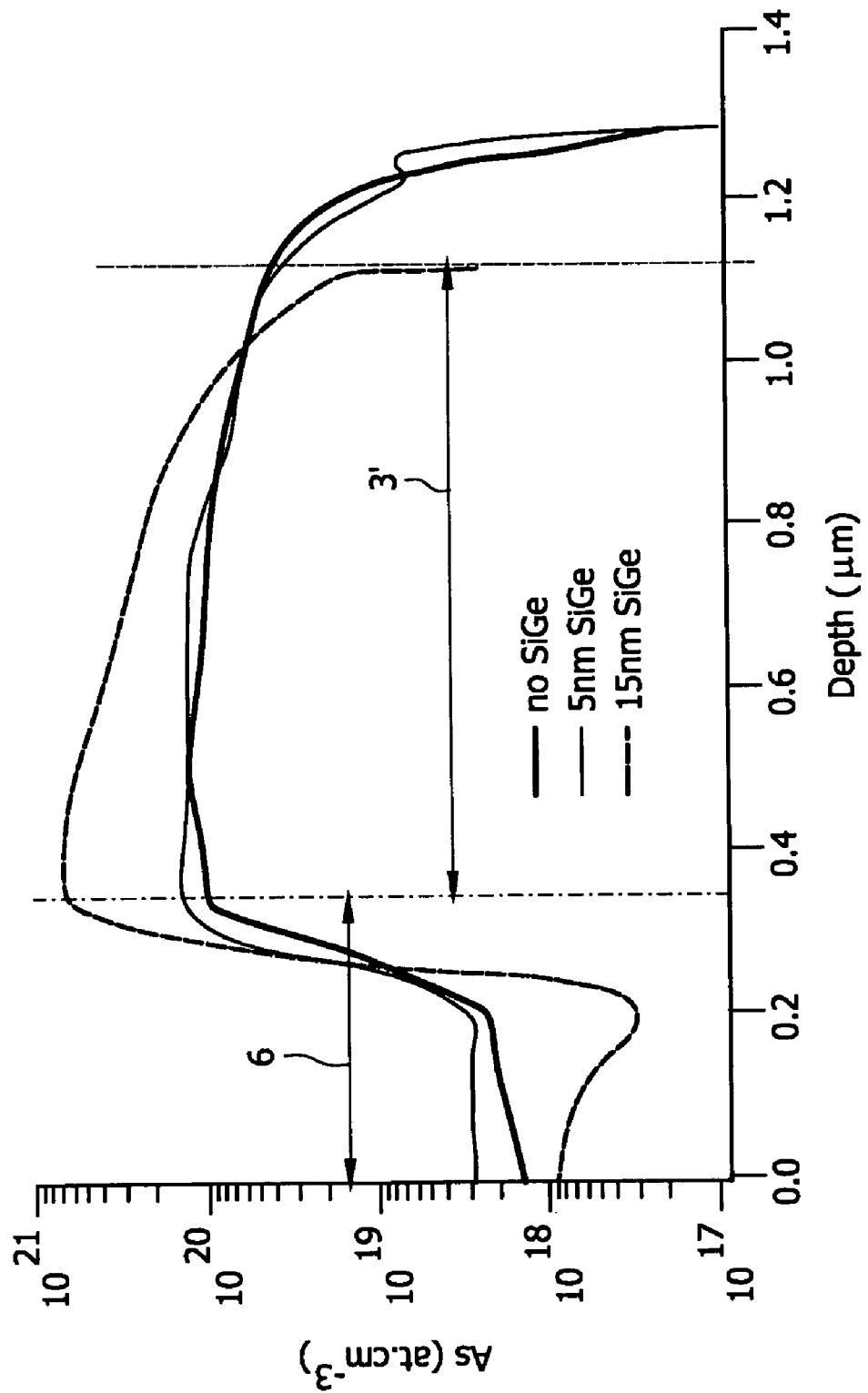
FIG. 2 shows measurement profiles of n-type dopants in a substrate and in an epitaxial layer on top of the substrate.
Figure 3:
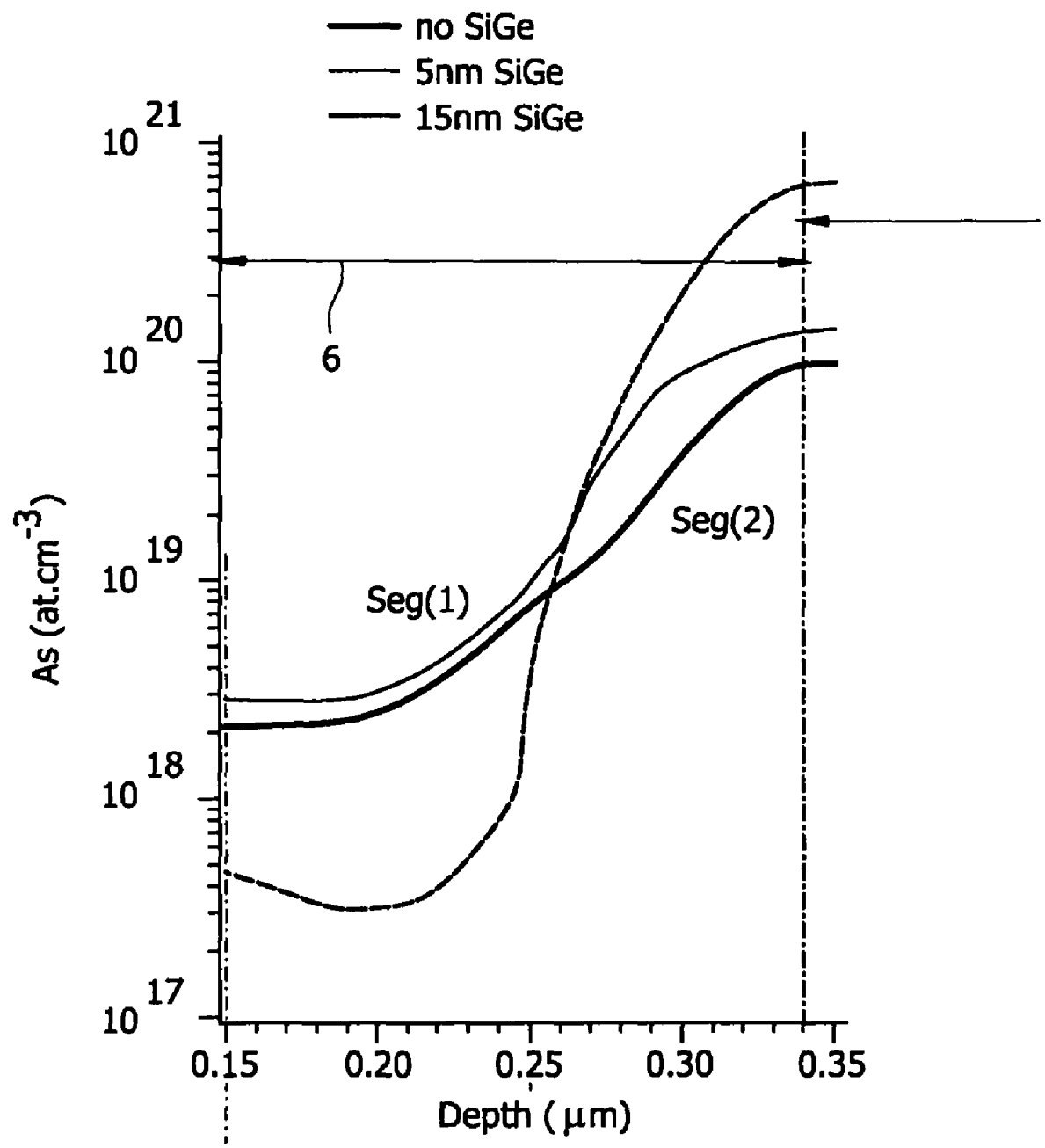
FIG. 3 shows a portion of FIG. 2 on an enlarged scale.

FIG. 2 shows measured profiles of As in at·cm$^{-3}$ as a function of depth in μm from the upper surface after growing of the epitaxial layer 6. Reference is also made to FIG. 3, which shows a portion of FIG. 2 on an enlarged scale, relating to a depth between 0.15 and 0.35 μm.

As can be clearly seen from FIGS. 2 and 3, there is a substantially reduced concentration of As within the epitaxial layer 6 extending down to 0.34 μm as compared with the buried layer 3'. During growing of the epitaxial layer 6, out-diffusion of As into the epitaxial layer 6 is not entirely prevented, but strongly reduced. The profiles show that, especially if a 15 nm SiGe layer 5 is used, As outdiffusion is slower than the epitaxial growth of layer 6, resulting in less outdiffusion than in the prior art.

Moreover, as indicated above, during growing of the SiO$_2$ layer 9, As has diffused easily into the SiGe layer 5' where the amount of Ge within the SiGe layer 5' layer was not too much, i.e. not directly at the interface between SiO$_2$ and Si but some distance away from that interface. Owing to this high diffusion capacity of As into the SiGe layer below the Ge-rich zone and owing to the total solubility of Ge in Si, an ordered SiGe layer is formed at the interface between the SiO$_2$ layer 9 and the buried layer 3'. This highly ordered SiGe layer forms, a very flat interface that is an excellent basis for subsequent epitaxial growth.

Thus the general idea of the present invention is to replace the n-type dopant in the substrate with another atom X that has "higher" segregation properties at the SiO$_2$/Si interface. This results in the following advantages:
the roughening of the SiO$_2$/Si interface is controlled by the Si—X layer 5, 5' sandwiched between the SiO$_2$ layer and the Si substrate 1. This allows the use of higher n-type dopant concentrations (or implanted doses);
the reduced amount of n-type dopant at the top layer of the buried layer reduces autodoping and/or outdiffusion.

Figure 1F:
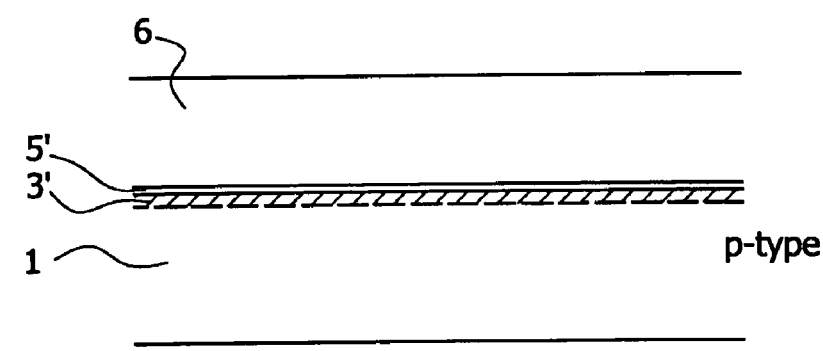

The semiconductor substrate as shown in FIG. 1f forms an intermediate product The buried layer 3' may be used as a collector in a pnp-transistor. All kinds of different (semiconductor) components may be manufactured in or on top of the epitaxial layer 6, as is known to those skilled in the art.

It has been shown above that SiGe layers can be used in the production of n-type buried layers. The method as explained above is compatible with the use of a SiGe layer, optionally with a predetermined amount of C, in producing p-type buried layers with reduced autodoping and and/or outdiffusion, e.g. as explained in US 2003/0082882. Note, however, that the SiGe layer is used in an entirely different way therein, i.e. when a SiGe layer is used on a p-type buried layer, the SiGe layer is used as a diffusion barrier which remains in place when the epitaxial layer is subsequently grown. The Ge and dopant atoms are not pushed into the silicon substrate by a growing SiO$_2$ layer as in the present invention.

The process actions as explained with reference to FIGS. 1a-1f are only intended as examples. Several modifications are possible, as will be evident to those skilled in the art.

For example, the actions shown in FIGS. 1b and 1c may be reversed, i.e. the buried layer 3 may be made first before the SiGe layer 5 (or any suitable atom species other than Ge) is provided on the substrate 1. This may be done, for example, by providing the insulating layer 2 directly on the substrate 1 and then performing the n-type implantation, e.g. with As, as explained with reference to FIG. 1c. The insulating layer 2 may then be removed, and the SiGe layer 5 as well as the Si layer 7 may be formed. If these actions are performed, the SiGe layer 5 may comprise fewer n-type dopants than in the method explained with reference to FIGS. 1a-1d.

Bipolar transistors may be produced in the epitaxial layer manufactured in accordance with the present invention having a steeper doping profile at the edge of the buried n-type layer. This is very advantageous since it increases the operating frequency of bipolar transistors, which may be >200 GHz.

To summarize, the following advantages may be obtained by the present invention in one time:

1. autodoping and/or outdiffusion during growing of the epitaxial layer are reduced;
2. surface roughness of the buried layer before growing of the epitaxial layer is reduced, which translates into a higher quality of the epitaxial layer and devices within and on the epitaxial layer produced afterwards, and
3. the resulting doping profile at the edge of the buried n-type layer is steeper than in the prior art.

The invention claimed is:

1. Method of producing a semiconductor product comprising the steps of:
   providing a semiconductor substrate;
   providing a Si—X layer on at least part of said semiconductor substrate, the Si—X layer having a first depth and X representing a predetermined atom species;
   providing said at least part of said semiconductor substrate with a doped layer with an n-type dopant material and having a second depth substantially greater than said first depth;
   performing an oxidation action to form a silicon dioxide layer having a silicon dioxide/silicon interface within said semiconductor substrate, such that X atoms and n-type atoms are pushed into said semiconductor substrate by said silicon dioxide layer at said silicon dioxide/silicon interface, said X atoms being selected such that they have a higher segregation property at said silicon dioxide/silicon interface than said n-type atoms;
   removing said silicon dioxide layer;
   growing an epitaxial layer of silicon on said semiconductor substrate.

2. Method according to claim 1, wherein said X atom species comprises Ge.

3. Method according to claim 1, wherein said n-type dopant material is at least one of As and P.

4. Method according to claim 1, wherein the step of providing said at least part of said semiconductor substrate with a doped layer comprises the sub-steps of:
   providing an insulation layer with a predetermined thickness on said at least part of said semiconductor substrate;
   performing an implantation action of said n-type dopant material through said insulation layer to produce said doped layer;
   removing said insulation layer.

5. Method according to claim 4, wherein said insulation layer comprises silicon dioxide.

6. Method according to claim 1, wherein said Si—X layer comprises a predetermined concentration of C.

7. Method according to claim 1, wherein said epitaxial layer comprises an n-type dopant at a lower concentration than a dopant concentration in the n-type doped layer in the semiconductor substrate.

8. Method according to claim 1, comprising a step of providing said semiconductor substrate with at least one other part with a p-type doped layer and a p-type epitaxial layer on top of said p-type doped layer.

9. Semiconductor device manufactured by the method according to claim 1.

10. Method of producing a silicon semiconductor substrate, comprising the steps of:
    providing a semiconductor substrate;
    providing at least part of said semiconductor substrate with a doped layer with an n-type dopant material and having a first depth;
    providing a Si—X layer on said at least part of said semiconductor substrate, having a second depth substantially smaller than said first depth, X representing a predetermined atom species;
    performing an oxidation action to form a silicon dioxide layer having a silicon dioxide/silicon interface within said semiconductor substrate, such that X atoms and n-type atoms are pushed into said semiconductor substrate by said silicon dioxide layer at said silicon dioxide/silicon interface, said X atoms being selected such that they have a higher segregation property at said silicon dioxide/silicon interface than said n-type atoms;
    removing said silicon dioxide layer;
    growing an epitaxial layer of silicon on said semiconductor substrate.

* * * * *